(12) United States Patent
Braman et al.

(10) Patent No.: US 7,919,717 B2
(45) Date of Patent: Apr. 5, 2011

(54) THREE-DIMENSIONAL PRINTED CIRCUIT BOARD

(75) Inventors: Todd L. Braman, New Brighton, MN (US); Myles A. Koshiol, St. Louis Park, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/161,872

(22) Filed: Aug. 19, 2005

(65) Prior Publication Data

US 2007/0062727 A1    Mar. 22, 2007

(51) Int. Cl.
*H01R 12/04* (2006.01)
*H05K 1/11* (2006.01)
*H01K 3/10* (2006.01)

(52) U.S. Cl. ............. 174/262; 174/266; 29/852; 29/853
(58) Field of Classification Search .......... 174/262–266; 361/792–795; 29/852, 853
See application file for complete search history.

(56) References Cited

U.S. PATENT DOCUMENTS

| | | | |
|---|---|---|---|
| 4,821,007 A * | 4/1989 | Fields et al. ................... 333/238 |
| 4,868,712 A * | 9/1989 | Woodman ..................... 361/689 |
| 5,109,479 A | 4/1992 | Williams |
| 5,914,534 A | 6/1999 | Todd et al. |
| 5,925,925 A | 7/1999 | Dehaine et al. |
| 6,084,778 A | 7/2000 | Malhi |
| 6,144,090 A | 11/2000 | Higashiguchi |
| 6,206,705 B1 | 3/2001 | Bolotin et al. |
| 6,219,240 B1 | 4/2001 | Sasov |
| 6,452,112 B1 * | 9/2002 | Terashima et al. ............ 174/260 |
| 6,534,726 B1 * | 3/2003 | Okada et al. .................. 174/263 |
| 6,675,472 B1 * | 1/2004 | Huang et al. ..................... 29/852 |
| 6,727,116 B2 * | 4/2004 | Poo et al. ...................... 438/106 |
| 6,737,738 B2 | 5/2004 | Koh et al. |
| 6,760,227 B2 * | 7/2004 | Sakai et al. ................... 361/736 |

(Continued)

FOREIGN PATENT DOCUMENTS

GB    2 395 605 A    5/2004

(Continued)

OTHER PUBLICATIONS

Karnick et al., "Honeywell Gun-Hard Inertial Measurement Unit (IMU) Development," Honeywell Defense and Space Electronics DFOISR #04-S-0593, pp. 1-7, prior to Aug. 19. 2005.

(Continued)

*Primary Examiner* — Jeremy C Norris
(74) *Attorney, Agent, or Firm* — Shumaker & Sieffert, P.A.

(57) ABSTRACT

A three-dimensional PWB is provided that may include two or more layers stacked together forming a top surface, a bottom surface, and one or more side surfaces, and one or more solder pad situated on at least one of the one or more side surfaces. The one or more solder pads may include exposed voids in the one or more side surfaces. In some cases, the top surface and/or the bottom surface may have one or more solder pad. The one or more solder pads on at least one of the one or more side surfaces may be electrically connected to the one or more solder pads on the top surface and/or the bottom surface. In the illustrative PWB, the top surface and/or the bottom surface may be adapted to be mounted with an inertial sensor. The one or more side surfaces may be adapted to be mounted to a printed wiring board.

20 Claims, 10 Drawing Sheets

U.S. PATENT DOCUMENTS

| | | |
|---|---|---|
| 6,918,297 B2 | 7/2005 | MacGugan |
| 6,964,749 B2 | 11/2005 | Zucker et al. |
| 2002/0006503 A1 | 1/2002 | Watanabe et al. .............. 428/209 |
| 2002/0093803 A1* | 7/2002 | Olzak et al. ................... 361/767 |
| 2002/0131252 A1 | 9/2002 | Hall et al. ..................... 361/760 |
| 2003/0038366 A1 | 2/2003 | Kozono |
| 2003/0070483 A1* | 4/2003 | Mueller .......................... 73/493 |
| 2003/0080819 A1 | 5/2003 | Jiles et al. ..................... 331/176 |
| 2003/0095389 A1 | 5/2003 | Samant et al. |
| 2004/0244510 A1 | 12/2004 | Harney et al. ................ 73/866.5 |

FOREIGN PATENT DOCUMENTS

WO     WO 02/069680 A2     9/2002

OTHER PUBLICATIONS

Search Report for PCT/US2006/019333 dated Jun. 30, 2008.
D. Karnick, "Honeywell Gun-Hard Inertial Measurement Unit (IMU) Development" Position Location and Navigation Symposium (Plans 2004), 2004, pp. 49-55, XP002483543.
EP Examination Report from corresponding EP Application No. 06 851 617.8, mailed Oct. 4, 2010, 10 pages.

\* cited by examiner

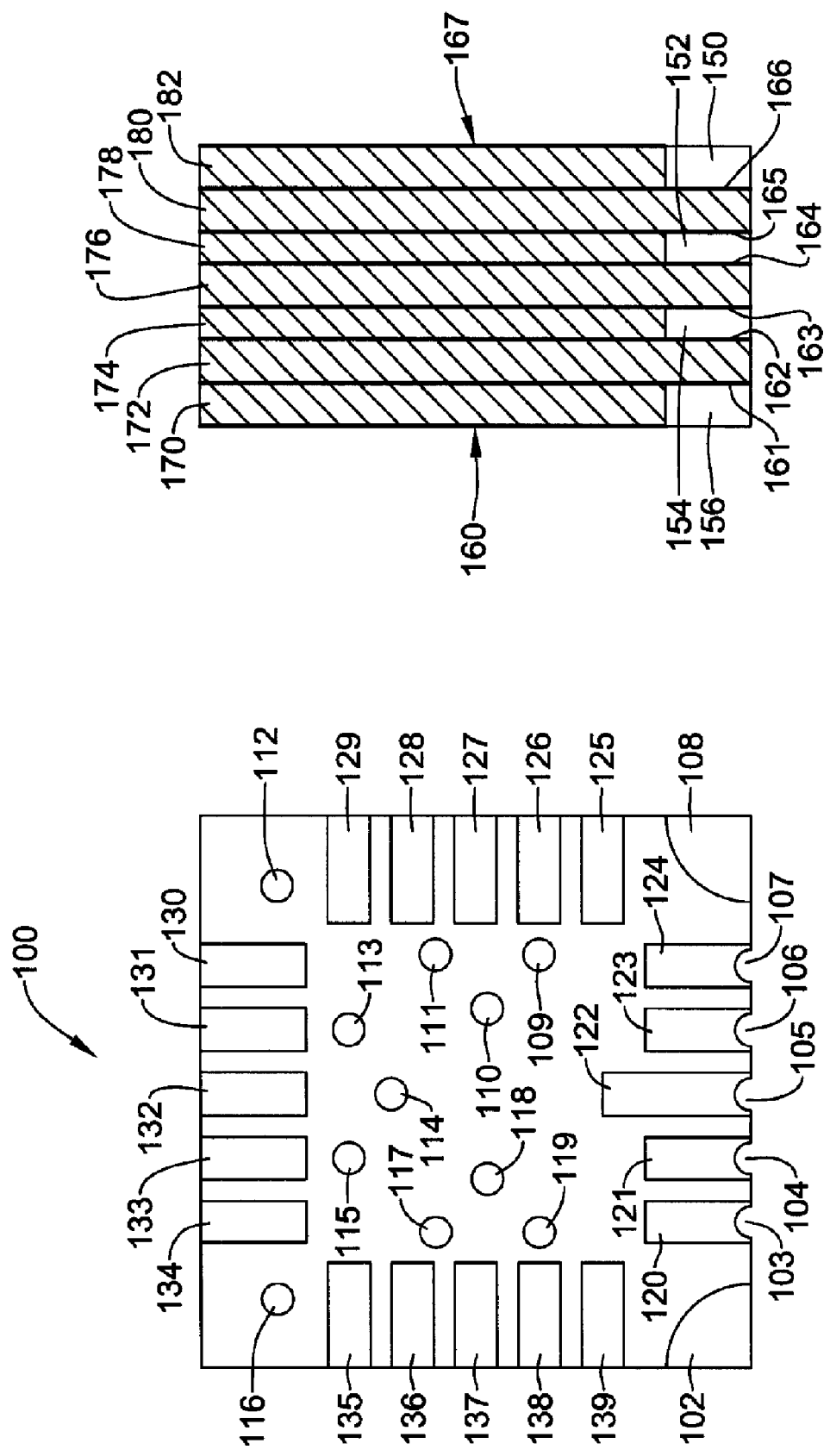

THREE-DIMENSIONAL PRINTED CIRCUIT BOARD

This invention was made with government support under the Excalibur Program contract number DAAE30-01-9-0100. The U.S. government may have certain rights in the invention.

FIELD

The present invention relates generally to printed wiring boards (PWB), and more particularly, to three-dimensional printed wiring circuit boards (PWB).

BACKGROUND

In many applications, such as, aeronautical, guidance, ballistic, as well as others, it may be desirable to have inertial measurement units (IMU) having sensor suites, such as an inertial sensor assembly (ISA), that can detect acceleration and rotation in three planes. To provide the measurements in three planes, at least one sensor is often mounted orthogonal to a PWB that carries the other sensors. To accomplish this, and in some cases, a ceramic block is provided that includes a bottom wall and a sidewall that extends up generally perpendicular to the bottom wall. The bottom wall often includes bond pads that are bonded to bond pads on a PWB. Likewise, the side wall often includes bond pads, and a sensor is mounted to the bond pads on the side wall so that the sensor is generally orthogonally mounted relative to the PWB. Traces are often provided along the outside surface of the ceramic block between the bond pads on the bottom wall and the bond pads on the side wall to make the desired electrical connections between the orthogonally mounted sensor and the PWB. The other sensors of the ISA may be mounted directly to the PWB.

It has been found that such conventional ceramic blocks may not be able to withstand the relatively high acceleration forces associated with some high dynamic environments, such as some aeronautical, guidance, and ballistic environments. In addition, little shielding is provided on the traces that travel along the outer surface of the ceramic block, which in some cases, can result in performance limiting noise particularly for some sensitive sensor signals. Also, conventional ceramic blocks can be relatively expensive to manufacture.

SUMMARY

The following summary of the invention is provided to facilitate an understanding of some of the innovative features unique to the present invention and is not intended to be a full description. A full appreciation of the invention can be gained by taking the entire specification, claims, drawings, and abstract as a whole.

The present invention generally relates to printed wiring boards (PWB), and more particularly, to three-dimensional printed wiring circuit boards (PWB). In one illustrative embodiment, a three-dimensional PWB is provided for mounting a sensor substantially perpendicular to another PWB, and may be used for use in an inertial sensor assembly (ISA), if desired. While this is one illustrative application, it is contemplated that the three-dimensional printed wiring circuit board (PWB) of the present invention may be used in any number of applications.

In one illustrative embodiment, a three-dimensional PWB is provided that includes two or more layers stacked together to form a PWB assembly that has a top surface, a bottom surface, and one or more side surfaces. Some the layers are conductive, while others are non-conductive or insulating layers. Generally, the conductive and insulating layers are stacked in an alternating sequence.

One more solder pad may be situated on at least one of the side surfaces. In some cases, the one or more solder pads on the side surfaces may be formed on exposed voids, but this is not required in all embodiments. The top surface and/or the bottom surface may also have one or more solder pads. The solder pads on the top surface and/or the bottom surface may be electrically connected to one or more solder pads on the one or more side surfaces to form a desired electrical connection or circuit. In one case, the electrical connections between the solder pads on the top surface and/or the bottom surface and the one or more solder pads on the one or more side surfaces may include one or more intervening VIAS that form a connection between two or more conducting layers of the three-dimensional PWB.

In some cases, the top surface and/or the bottom surface of the three-dimensional PWB may be adapted to accept an inertial or some other type of sensor or electrical component, and the one or more side surfaces may be adapted to be mounted to a printed wiring assembly. However, other configurations may be used.

BRIEF DESCRIPTION

FIG. 2 is a top view of an illustrative three-dimensional PWB 100;

FIG. 3 is a side view of the illustrative three-dimensional PWB 100 shown in FIG. 2;

Figures 4A, 4B:
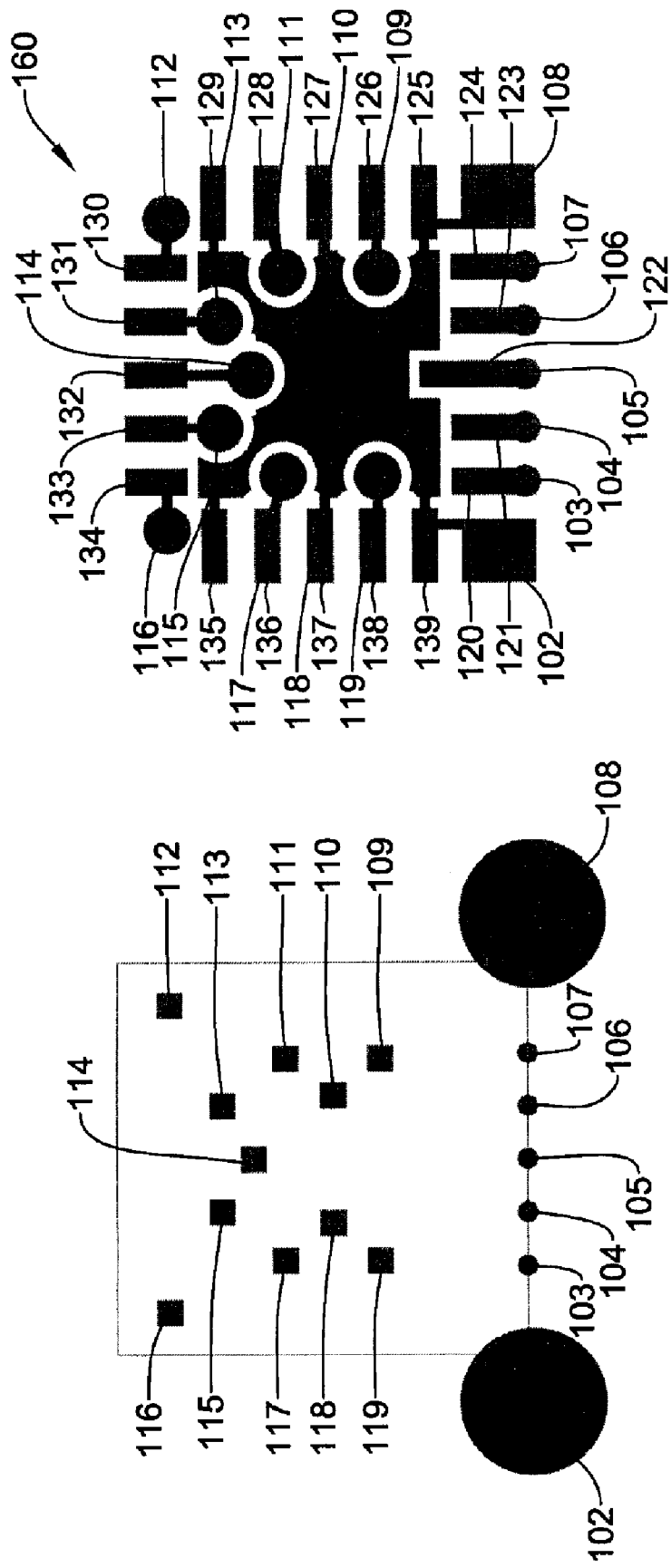

FIG. 4*a* is a top view of a hole pattern for the illustrative three-dimensional PWB 100 of FIG. 3.

Figure 4D:
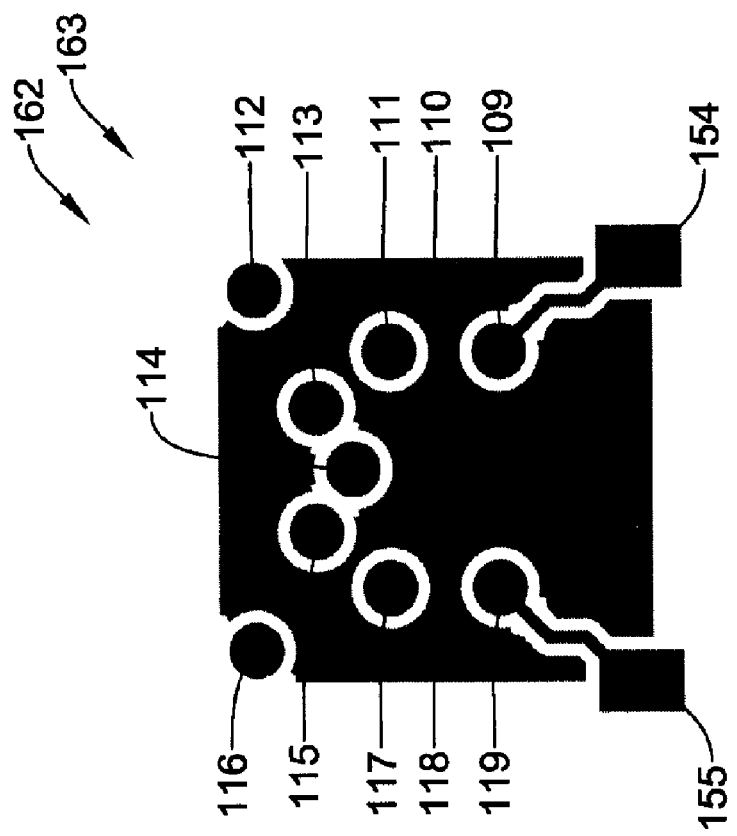
Figure 4C:
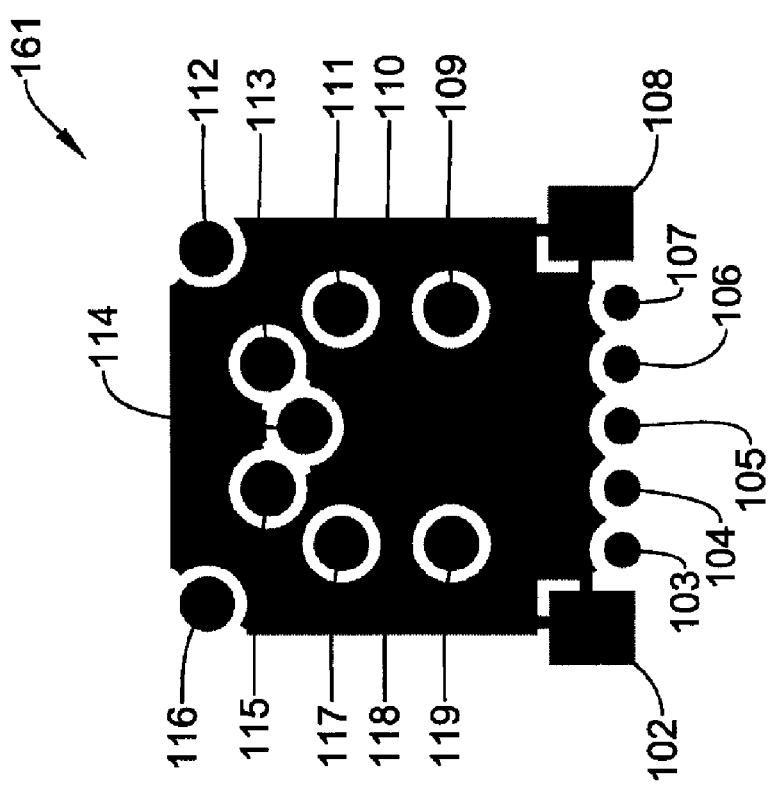
Figures 4E, 4F:
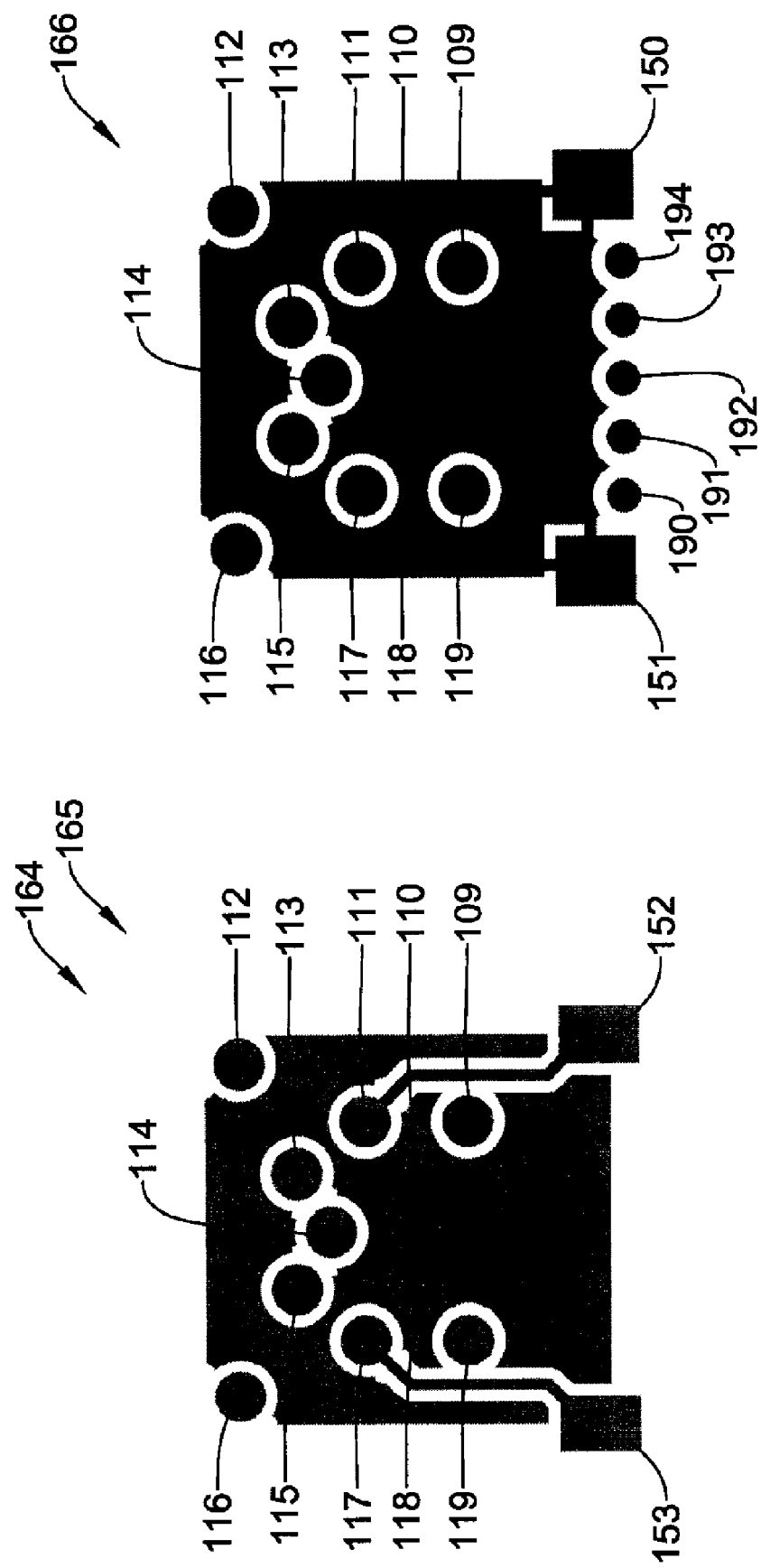
Figure 4G:
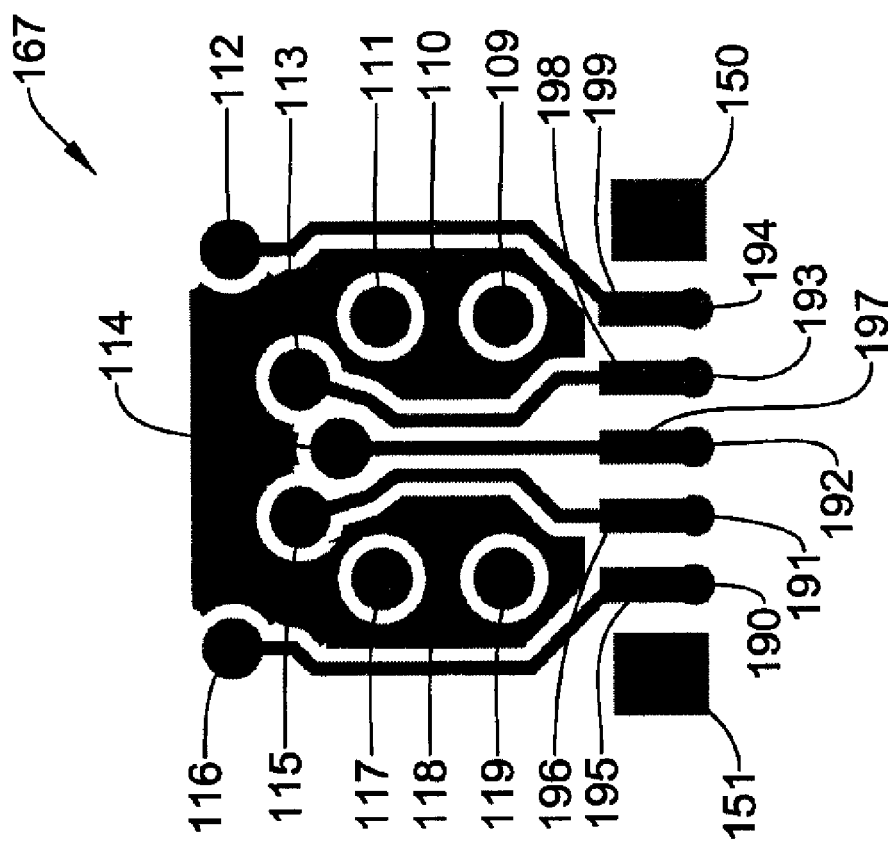
Figure 5:
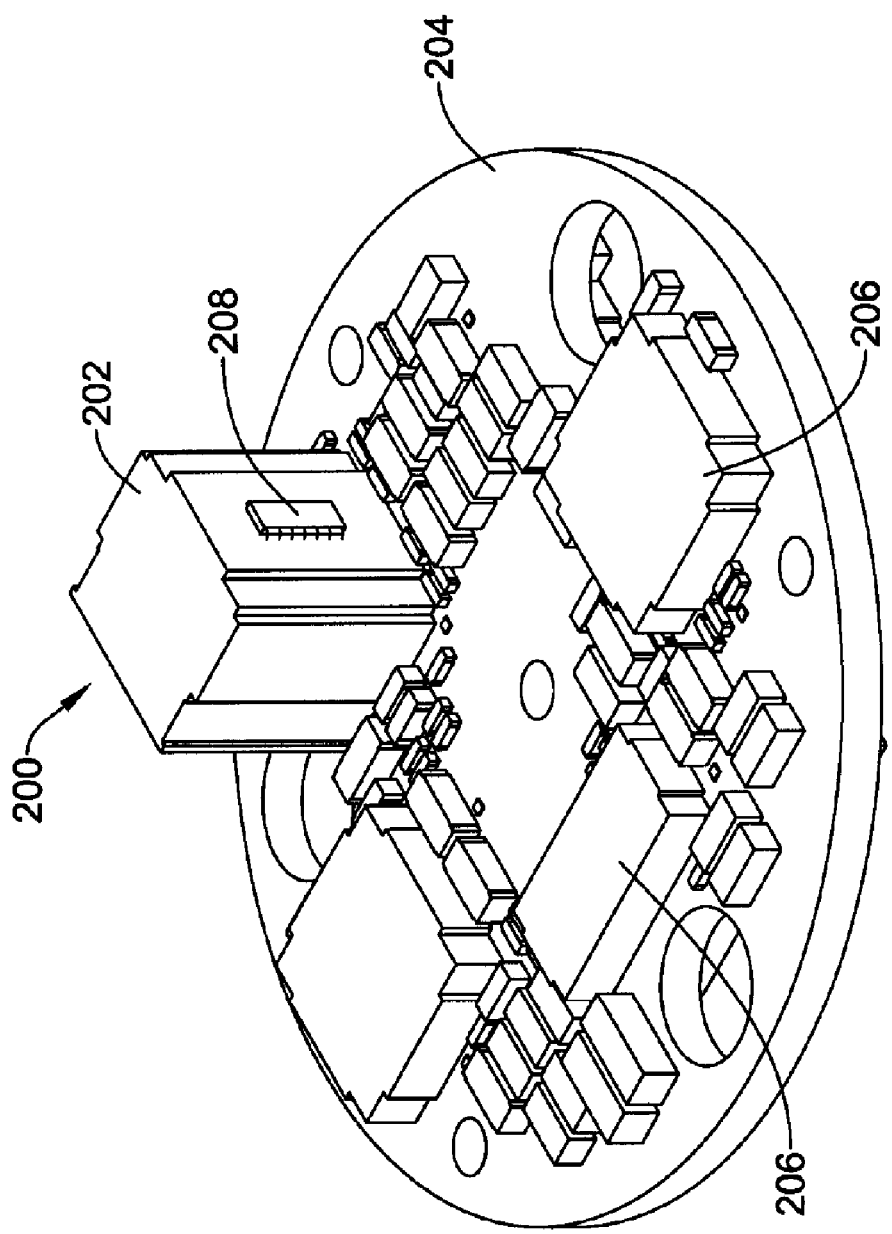
Figure 6:
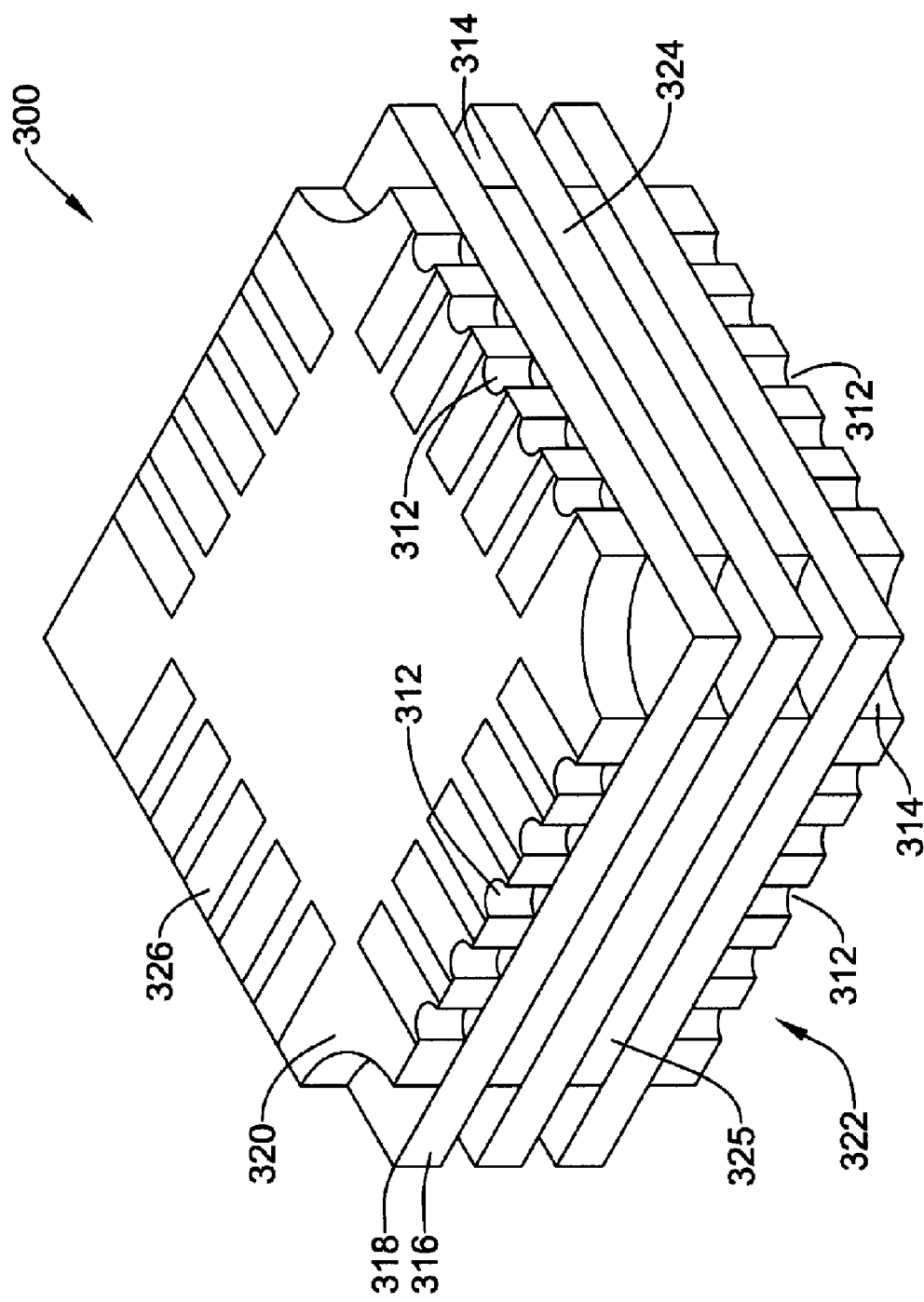
Figure 7:
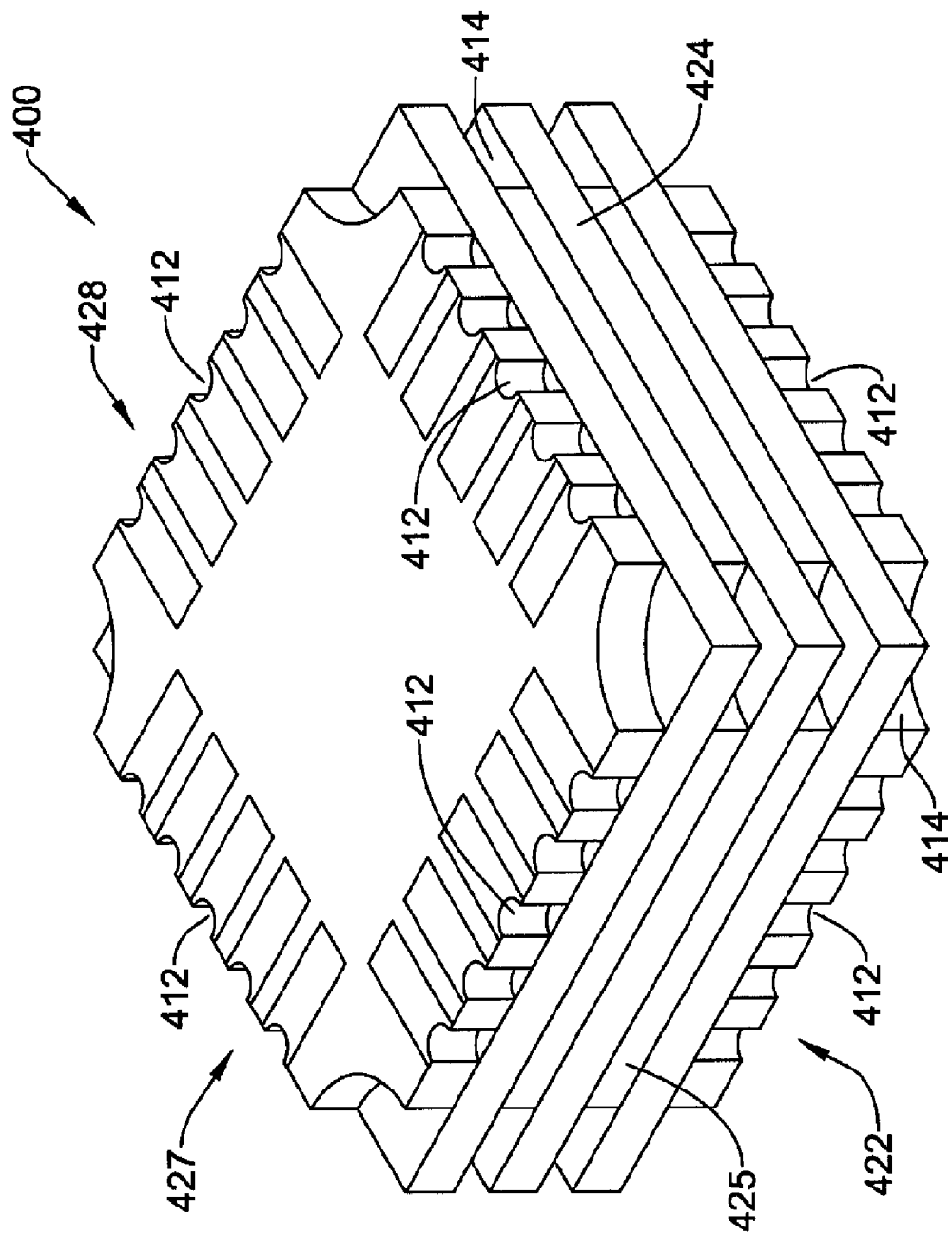
Figure 8:
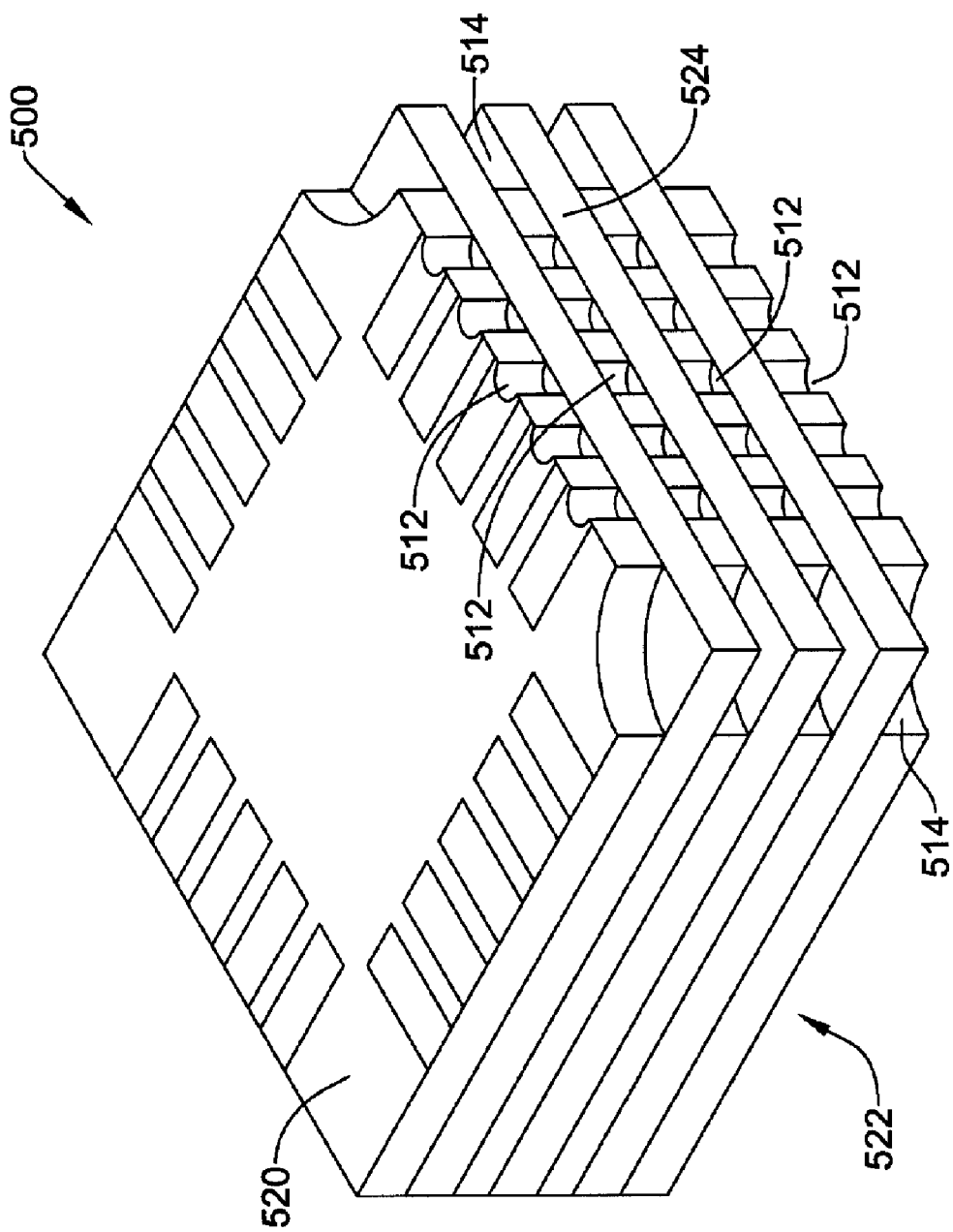

FIG. 4*b* is a top view of a trace pattern for conductive layer 1 of the illustrative three-dimensional PWB of FIG. 3;

FIG. 4*c* is a top view of a trace pattern for conductive layer 2 of the illustrative three-dimensional PWB of FIG. 3;

FIG. 4*d* is a top view of a trace pattern for conductive layers 3 and 4 of the illustrative three-dimensional PWB of FIG. 3;

FIG. 4*e* is a top view of a trace pattern for conductive layers 5 and 6 of the illustrative three-dimensional PWB of FIG. 3;

FIG. 4*f* is a top view of a trace pattern for conductive layer 7 of the illustrative three-dimensional PWB of FIG. 3;

FIG. 4*g* is a top view of a trace pattern for conductive layer 8 of the illustrative three-dimensional PWB of FIG. 3;

FIG. 5 is a perspective view of an illustrative embodiment of a three-dimensional PWB mounted on a circuit board;

FIG. 6 is a perspective view of another illustrative embodiment of a three-dimensional PWB;

FIG. 7 is a perspective view of yet another illustrative embodiment of a three-dimensional PWB; and FIG. 8 is a perspective view of another illustrative embodiment of a three-dimensional PWB.

DETAILED DESCRIPTION

The following description should be read with reference to the drawings wherein like reference numerals indicate like elements throughout the several views. The detailed description and drawings show several embodiments which are meant to be illustrative of the claimed invention.

Figure 1:
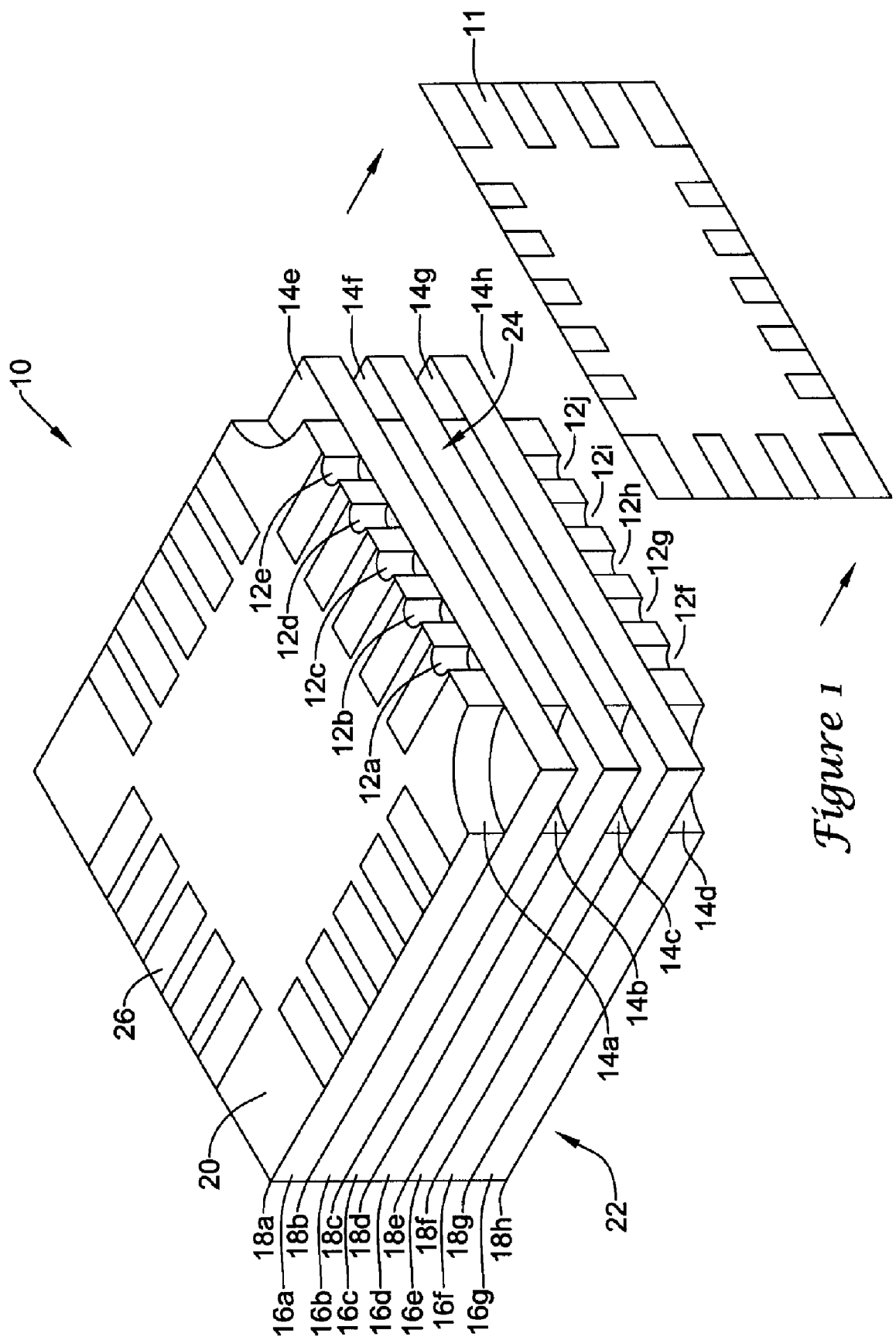
FIG. 1 is a perspective view of an illustrative three-dimensional printed wiring board in accordance with the present invention.

FIG. 1 is a perspective view of an illustrative three-dimensional printed wiring board 10 in accordance with the present invention. The illustrative PWB 10 includes two or more layers 16, 18 stacked together to form a PWB assembly having a top surface 20, a bottom surface 22 and one or more side surfaces 24. One or more solder pads, such as solder pads, 12a-12j and 14a-14h, may be situated on at least one of the side surfaces 24. The top surface 20 of the PWB 10 and/or the bottom surface 22 of the PWB 10 may also have one or more solder pads, such as solder pad 26. The illustrative two or more layers 16, 18 may include one or more conductive layers 18a-18h and one or more insulating layers 16a-16g.

In some cases, the conductive layers 18a-18h may be copper, however, it is contemplated that any conductive material may be used as desired. Furthermore, in some cases, the insulating layers 16a-16g may be a dielectric material, such as fiberglass. However, it is contemplated that any insulating material may be used as desired. In some cases, the thickness of the conductive layers 18a-18h may be less than that of the insulating layers 16a-16g, but this is not required. In one case, the conductive layers 18a-18h may be 0.0014 inches thick, and the illustrative insulating layer 16a-16g may be 0.030 inches thick. It is contemplated, however, that the thickness of the one or more insulating layer 16a-16g and the one or more conductive layers 18a-18h may be any suitable thickness, as desired.

The illustrative PWB 10 may have any number of desired layers. Moreover, the illustrative PWB 10 may have electrical interconnects between the top surface 20, the bottom surface 22, and/or at least one of the one or more side surfaces 24. The electrical interconnects may include a conducting path that electrically connects mountable components, devices, circuits, circuit boards, PWAs, or any other devices, components, or material as desired. In one illustrative embodiment, the electrical interconnects may include a conductive path between, for example, solder pad 26 on the top surface 20 and solder pad 12h on the side surfaces 24.

As indicated above, the illustrative three-dimensional PWB 10 may have one or more solder pads 12a-12j and 14a-14h situated on at least one of the one or more side surfaces 24. In some cases, the solder pads 12a-12j and 14a-14j may be formed by removing a portion of selected layers 16a-16g and 18a-18h to create exposed voids on the side surface 24 of the PWB 10. A void may be a region in the illustrative PWB 10 layer 16a-16g and/or 18a-18h where the layer material, such as fiberglass or copper, may have been removed across the thickness of the layer. In the illustrative PWB 10, the top conductive layer 18a and/or the top insulating layer 16a have one or more exposed voids on the side surface 24 along the top 20 of PWB 10. Additionally, in the illustrative PWB 10, the bottom conducting layer 18h and/or the bottom insulating layer 16g have one or more exposed voids along the bottom 22 of the PWB 10. Moreover, as illustrated, the corners of selected insulating layers 16 and/or conducting layers 18 may also have exposed voids creating solder pads 14a-14h. More generally, it is contemplated that any layer of the PWB 10 may include an exposed void on the side surface 24 (or other side surfaces), which may be used to help create solder pads, such as solder pads 12a-12j and 14a-14h. The illustrated exposed voids are depicted as circular, however, it is contemplated that they may have any desired shape. Also, in some cases, the internal surface of the illustrative voids may be coated with a conductor, such as for example, copper. However, any conductor may be used to coat the voids to form solder pads, as desired. The illustrative exposed voids may help give the solder, which may be used to solder bond the PWB 10 to another PWB or other component, a place to flow and also to increase the bonding surface area, which may help increase the strength of the solder bond, as desired.

As noted above, the illustrative PWB 10 may also have solder pads 26 on the top surface 20. In some cases, the PWB 10 may also have solder pads (not shown) on the bottom surface 22. These solder pads 26 may help facilitate the mounting of devices or components on the top surface 20 and/or bottom surface 22 of the three-dimensional PWB 10, as desired. The devices or components mounted on the PWB 10 may be, for example, inertial sensors, such as gyros or accelerometers, or other type of sensor or electrical component as desired. The devices or components may be micro-electro-mechanical system (MEMS) devices or components.

In some embodiments, the illustrative PWB 10 may have one or more VIAS through the two or more layers to interconnect two conducting layers. Furthermore, there may be traces in at least selected conducting layers 18a-18h to connect the vias with desired solder pads 12a-12j and/or 14a-14h to facilitate the electrical connection between the top surface 20 and/or bottom surface 22 and the one or more side surfaces 24.

In some cases, the exposed voids on the PWB 10 may facilitate forming a stronger bond between the three-dimensional PWB 10 and another circuit board 11, such as a printed wiring assembly (PWA), another three-dimensional PWB, or any other type of circuit board or device as desired. In some cases, the illustrative three-dimensional PWB 10 may be mounted vertically from circuit board 11, with the side surface 24 facing the circuit board 11. One or more of the solder pads 12a-12j and/or 14a-14h may be placed in registration with, and bonded to, solder pads on the circuit board 11, forming a vertical assembly extending from the circuit board 11. In this configuration, the illustrative PWB 10 may function as an orthogonal mount for a sensor, or other circuit, as desired.

The illustrative three-dimensional PWB 10 may have many advantages, such as enhanced material strength properties, enhanced shielding capabilities for signal lines, symmetric design capabilities, stable capacitance, low cost, as well as many others. Furthermore, the lightweight design of the three-dimensional PWB 10 may increase the gun hardness of the vertical assembly in some ballistic applications.

Much of the illustrative three-dimensional PWB 10 may be made using traditional PWB processing techniques. If exposed voids are desired to help created bond pads on the side surface 24 of the PWB 10, additional steps may be provided. In some cases, holes may be drilled in the internal layers, and then the layers may be cut through the center of the holes to create the exposed voids shown in FIG. 1. This step may be performed before the individual layers 16a-16g and 18a-18h of the three-dimensional PWB 10 are stacked together, or in some cases, after they are stacked together. For example, large individual layers 16a-16g and 18a-18h may be initially 12 inches by 18 inches, from which many PWB 10 board will be formed. In some cases, the individual PWB 10 may be 0.3 to 0.4 inches square, or any other size as desired. Traditionally, the copper or conductive layers 18a-18h may be etched or otherwise patterned to form desired traces, and then laminated together with insulating layers to form a PWB stack. The illustrative PWB 10 may pattern the copper of the conductive layers 18a-18h, then drill holes in the individual layers, and then laminate the layers together. The holes may be drilled in a desired pattern, for example, as shown in FIG. 4a. However, any suitable pattern may be used as desired.

After the lamination step, there may be voids left in the large layers. The larger layers may then be routed or cut along the center of the holes, such that exposed voids are present on the side surfaces of the individual PWBs, as shown in FIG. 1. If using a dielectric prepreg material is used that can possibly flow during the lamination process of the various layers, it has been found that some of the prepreg can flow into the voids. A plasma cleaning, etching or other suitable process may be used to remove the unwanted prepreg material from the voids, if desired.

The illustrative PWB 10 may be plated along the side surfaces 24 of the PWB 10 to plate the voids with a conductive material such as copper. After the voids are plated, there may be a secondary route or cut to isolate the voids, if desired. The plated conductive material may form the electrical contacts, or solder pads 12a-12j and 14a-14h on the side 24 of the three-dimensional PWB 10 and help the three-dimensional PWB 10 to be electrically connected when mounted orthogonally to the circuit board 11. In another illustrative method, the holes may be plated before the larger layers are cut, and once cut, plated exposed voids may be revealed.

The illustrative PWB 10 shown in FIG. 1 includes four solder pads 14a-d and 14e-h on each corner of the side surface 24, and five more solder pads 12a-e and 12f-j between the corner solder pads 14 in selected layers. The five solder pads 12a-e may be in the top layer, and the five solder pads 12f-j may be in the bottom layer. It is contemplated that any number of solder pads 12a-12j may be formed as desired. The illustrative side surface 24 shown may be the side surface that is mounted onto another circuit board 11 or other device, so that the PWB 10 may be mounted vertically and that any device or component mounted on the top surface 20 or bottom surface 22 may be orthogonal to the circuit board 11, and any devices or components mounted on the circuit board 11.

FIG. 2 is a top view of an illustrative three-dimensional PWB 100. In one case, the illustrative three-dimensional PWB 100 may have dimensions of approximately 0.40 inches by 0.37 inches, but it is contemplated that any suitable dimensions may be used. The illustrative top view of the PWB 100 includes plated solder pads 102, 103, 104, 105, 106, 107, 108 situated along the side of the board 100. Additionally, the illustrative three-dimensional PWB 100 may have solder pads 120, 121, 122, 123, 124, 125, 126, 127, 128, 129, 130, 131, 132, 133, 134, 135, 136, 137, 138, 139 along on the top surface of the PWB 100. Furthermore, the illustrative PWB 100 may have VIAS 109, 110, 111, 112, 113, 114, 115, 116, 117, 118, 119 through at least some of the layers of the PWB 100. Some of the illustrative solder pads 120, 121, 122, 123, 124, 125, 126, 127, 128, 129, 130, 131, 132, 133, 134, 135, 136, 137, 138, 139 on the top surface may be electrically connected to solder pads 102, 103, 104, 105, 106, 107, 108 on the side surfaces through one or more of the VIAS 109, 110, 111, 112, 113, 114, 115, 116, 117, 118, 119 and traces.

FIG. 3 is a side view of the illustrative three-dimensional PWB 100 shown in FIG. 2. The illustrative three-dimensional PWB 100 includes eight conductive layers 160, 161, 162, 163, 164, 165, 166, 167, each shown as a dark line. More generally, any number of conductive layers may be used as desired. Situated between each conductive layer 160, 161, 162, 163, 164, 165, 166, 167 is an insulating layer 170, 172, 174, 176, 178, 180, 182, which function to electrically isolate the conductive layers 160, 161, 162, 163, 164, 165, 166, 167 from one another. As depicted, the illustrative three-dimensional PWB 100 may have portions of the layers 170, 174, 178, 182 removed creating voids 150, 152, 154, 156 along one or more sides. However, in some embodiments, voids may not be provided.

The illustrative PWB 100 may have a thickness of approximately 0.20 inches, but this is not required. The illustrative conducting layers 160, 161, 162, 163, 164, 165, 166, 167 may be laminated copper layers each having a thickness of about 0.0014 inches. In the illustrative embodiment, eight of these layers are illustrated. However, it is contemplated that there may be any number of conducting layers as desired. All the illustrative conducting layers 160, 161, 162, 163, 164, 165, 166, 167 may be made from the same material and have the same thickness. However, it is contemplated that any conductive material or thickness may be used in the individual conducting layers 160, 161, 162, 163, 164, 165, 166, 167, as desired.

A first insulating layer 170 may be situated between the first conducting layer 160 and the second conducting layer 161. The first insulating layer 170 may be a dielectric layer with a thickness of about 0.03 inches and a second dielectric prepreg layer with a thickness of about 0.004 inches. A second insulating layer 172 may be situated between the second and third conducting layers 161 and 162. This layer 172 may be a dielectric layer having a thickness of about 0.03 inches. A third insulating layer 174 may be situated between the third and fourth conducting layers 162 and 163. The third insulating layer 174 may include a dielectric prepreg layer having a thickness of about 0.004 inches, a dielectric layer having a thickness of about 0.012 inches, and a second prepreg layer having a thickness of about 0.004 inches. A fourth insulating layer 176 may be situated between the fourth and fifth conducting layers 163 and 164. This layer 176 may be a dielectric layer having a thickness of about 0.03 inches. A fifth insulating layer 178 may be situated between the fifth and sixth conductive layers 164 and 165. The fifth insulating layer 178 may include a dielectric prepreg layer having a thickness of about 0.004 inches, a dielectric layer having a thickness of about 0.012 inches, and a second prepreg layer having a thickness of about 0.004 inches. A sixth insulating layer 180 may be situated between the sixth and seventh conducting layers 165 and 166. This layer 180 may be a dielectric layer having a thickness of about 0.03 inches. A seventh insulating layer 182 may be situated between the seventh conducting layer 166 and eighth conducting layer 167. The seventh insulating layer 182 may be have a dielectric layer with a thickness of about 0.03 inches and a second dielectric prepreg layer with a thickness of about 0.004 inches. Situated outside the first conducting layer 160 and the eighth conducting layer 167 may be a plated copper layer (not shown) having a thickness of about 0.001 inches. More generally, there may be any number of conducting layers 160, 161, 162, 163, 164, 165, 166, 167 having any suitable thickness and any number of insulating layers 170, 172, 174, 176, 178, 180, 182 have any suitable, as desired.

In some cases, the thickness of the insulating layers may be set at or near the spacing between solder bond pads on a circuit board that the PWB 100 is going to be attached. Alternatively, the spacing of the solder bond pads on the circuit board that the PWB 100 is going to be attached may be set to correspond to the thickness of the insulating layers on the PWB 100.

FIG. 4a is a top view of a hole pattern layer for the illustrative three-dimensional PWB 100 of FIG. 3. The illustrative diagram shows the regions and relative sizes of the holes that may be drilled in the layers of the PWB 100. The VIAS 109, 110, 111, 112, 113, 114, 115, 116, 117, 118, 119 may be drilled in the individual layers prior to stacking the layers together or may be drilled after the layers have been stacked together. The illustrative voids 102, 103, 104, 105, 106, 107, 108 may be created along the edge of one or more of the PWB layers. In some cases, voids 103, 104, 105, 106, and 107 may be made with a smaller hole than voids 102, and 108. However, any size hole may be used to create the voids 102, 103, 104, 105, 106, 107, 108. As detailed above, the individual layers may be cut so as to expose the voids 102, 103, 104, 105,

106, 107, 108 along the edge of the PWB 100. The illustrative hole pattern may be used for any or every layer of the PWB 100, as desired.

FIG. 4b is a top view of a trace pattern for conductive layer 160 of the illustrative three-dimensional PWB 100 of FIG. 3. As depicted, the illustrative vias 109, 111, 112, 113, 114, 115, 116, 117, 119 may be connected to solder pads 126, 128, 130, 131, 132, 133, 134, 136, 138 on the illustrative three sides without the voids 102, 103, 104, 105, 106, 107, 108 using traces. The voids 102, 103, 104, 105, 106, 107, 108 may be connected to solder pads 139, 120, 121, 122, 123, 124, 125 on the top surface of the PWB 100 that are adjacent to the void 102, 103, 104, 105, 106, 107, 108. Illustrative solder pads 139, 120, 121, 122, 123, 124, 125 may not be connected to any VIAS 109, 111, 112, 113, 114, 115, 116, 117, 119, but rather may be connected to a conductive region that helps serve as a ground layer for shielding purposes. The trace pattern shown in FIG. 4b may provide the electrical connections for a component that may be mounted to the top surface of the PWB 100.

FIG. 4c is a top view of a trace pattern for conductive layer 161 of the illustrative three-dimensional PWB 100 of FIG. 3. In layer 161, none of the VIAS 109, 111, 112, 113, 114, 115, 116, 117, 119 are shown electrically connected to solder pads through traces. Instead, much of layer 161 is dedicated to providing shielding to internal traces in the PWB 100.

FIG. 4d is a top view of a trace pattern for conductive layers 162 and 163 of the illustrative PWB 100 of FIG. 3. The corners of layers 162 and 163 may form solder pads 154 and 155 that are connected to VIAS 109 and 119. VIAS 109 and 119 may be connected to solder pads 126 and 138 on layer 106 to facilitate the electrical connection of the components to the circuit board. The illustrative layers 162 and 163 may define a cavity for the solder pads, such as solder pad 154, as illustrated in FIG. 3.

FIG. 4e is a top view of a trace pattern for conductive layers 164 and 165 of the illustrative PWB 100 of FIG. 3. The corners of layers 164 and 165 may form solder pads 152 and 153 that may be connected to VIAS 111 and 117 by traces. The illustrative VIAS 111 and 117 may be connected to solder pads 128 and 136 on layer 160 to facilitate the electrical connection of the components to the circuit board. The illustrative layers 164 and 165 may define a cavity for the solder pads, such as solder pad 152, as illustrated in FIG. 3.

FIG. 4f is a top view of a trace pattern for conductive layer 166 of the illustrative PWB 100 of FIG. 3. The illustrative layer 166 may be similar to layer 161 in that none of the VIAS 109, 111, 112, 113, 114, 115, 116, 117, 119 are electrically connected to solder pads through traces. Layer 166 may be a shielding layer.

FIG. 4g is a top view of a trace pattern for conductive layer 167 of the illustrative PWB 100 of FIG. 3. The one or more solder pads 190, 191, 192, 193, 194 formed on the side of the PWB 100 may be electrically connected to solder pads 195, 196, 197, 198, 199, which may be connected to respective VIAS 116, 115, 114, 113, 112 through traces. The VIAS 116, 115, 114, 113, 112 may allow the electrical connection of a device (mounted on layer 160) to a circuit board, which may be mounted to solder pads 190, 191, 192, 193, 194 on the side of the PWB 100. The illustrative traces may connect solder pads 190, 191, 192, 193, 194 to the VIAS 116, 115, 114, 113, 112 as shown.

FIG. 5 is a perspective view of an illustrative embodiment of a PWB 202 mounted on a circuit board 204. The illustrative three-dimensional PWB, generally shown at 202, may be mounted on circuit board 204 so that the side of the illustrative PWB 202 with solder pads may be in registration with, and soldered to, corresponding solder pads on the circuit board 204, forming a vertical assembly 200. The illustrative three-dimensional PWB 202 mounted on the circuit board 204 may be used in a sensor suite such as, for example, an inertial sensor assembly (ISA), an inertial measurement unit (IMU), or it may be used in any other device that may desire an orthogonal mount. The illustrative circuit board 204 may be a printed wiring circuit board (PWB), printed wiring assembly (PWA), or any circuit board or device as desired. In some cases, the circuit board 204 may also have other components 206 mounted thereon. The other components may include other sensors or other devices, as desired. As illustrated, the three-dimensional PWB 202 may have a sensor 208 mounted thereon. In some cases, the sensor 208 may be a MEMS gyro or MEMS accelerometer. However, it is contemplated that any sensor 208 or device may be mounted on the three-dimensional PWB 202 as desired.

FIG. 6 is a perspective view of another illustrative embodiment of a three-dimensional PWB 300. The illustrative PWB 300 includes two or more layers 316, 318 stacked together forming a top surface 320, a bottom surface 322 and one or more side surfaces 324 and 325. Like above, the two or more layers 316, 318 may include one or more conductive layers 318 and one or more insulating layers 316. As illustrated, the solder pads 312, 314 may be situated on two of the side surfaces 324 and 325 of the PWB 300. The illustrative two side surfaces 324 and 325 may be adjacent to each other, as illustrated, or may be on opposite sides, as desired. Thus, the illustrative PWB 300 may have solder pads 326 on the top surface 320, the bottom surface 322, and two side surfaces 324 and 325, or any combination thereof as desired.

FIG. 7 is a perspective view of another illustrative embodiment of a three-dimensional PWB 400. As illustrated, solder pads 412, 414 may be situated on all four of the side surfaces 424, 425, 427, 428 of the PWB 400. However, it is contemplated that the illustrative PWB 400 may have solder pads 412, 414 on one of the side surfaces 424, two of the side surfaces 424, 425, three of the side surfaces 424, 425, 427, four of the side surfaces 424, 425, 427, 428, or any number of side surfaces 424, 425, 427, 428 as desired. Thus, the illustrative PWB 400 may have solder pads 412, 414 on the top surface 420, the bottom surface 422, and/or any combination of side surfaces 424, 425, 427, 428 as desired.

FIG. 8 is a perspective view of another illustrative embodiment of a three-dimensional PWB 500. In this illustrative embodiment, solder pads 512, 514 are provided in multiple layers of the PWB 500. In previous figures, the solder pads on the side surfaces where depicted in the outermost layers and along the corners of the middle layers. However, as illustrated, the PWB 500 may have solder pads 512, 514 in any of the layers, outer or middle as desired. As illustrated, the PWB may have solder pads 512, 514 in all the layers of the PWB 500. However, it is contemplated that the PWB 500 may have solder pads 512, 514 in one outer layer, both outer layers, one middle layer, multiple middle layers, or any combination thereof, as desired.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respect, only illustrative. Changes may be made in details, particularly in matters of shape, size, and arrangement of parts without exceeding the scope of the invention. The invention's scope is, of course, defined in the language in which the appended claims are expressed.

What is claimed is:

1. A printed wiring board (PWB) comprising:
   one or more insulating layers stacked together forming a top surface, a bottom surface, and one or more side surfaces, wherein one of the top and bottom surfaces is configured to be mounted to a first circuit board; and
   one or more solder pads situated on at least one of the one or more side surfaces, at least one of the solder pads electrically connecting to at least one of the top surface and the bottom surface through at least one VIA and trace, wherein at least one of one or more side surfaces is configured to be mounted to a second circuit board, and wherein at least one of the one or more solder pads extends from at least one of the one or more side surfaces to at least one of the top surface and the bottom surface and comprises a solder pad on the at least one of the top surface and the bottom surface.

2. The PWB of claim 1 wherein the one or more solder pads include an exposed void in the one or more side surfaces.

3. The PWB of claim 2 wherein the two or more insulating layers stacked together include one or more conductive layers positioned between the two or more insulating layers.

4. The PWB of claim 3 wherein the voids in the one or more side surfaces are in the one or more insulating layers.

5. The PWB of claim 3 wherein the voids in the one or more side surfaces are in the one or more conducting layers.

6. The PWB of claim 3 wherein plating is applied to at least some of the voids.

7. The PWB of claim 1 wherein at least one of the top surface and the bottom surface have one or more solder pads.

8. The PWB of claim 1 wherein the first circuit board is mounted on the bottom surface and wherein the top surface is adapted to receive an inertial sensor.

9. The PWB of claim 8 wherein the second circuit board includes an inertial sensor.

10. The PWB of claim 1, wherein a first side surface and a second side surface of the one or more side surfaces forms a side edge of the PWB, the PWB further comprising at least one solder pad situated at the side edge of the PWB.

11. The PWB of claim 10, wherein the first side surface, the second side surface, and at least one of the top surface or the bottom surface of the PWB form a corner of the PWB, the PWB further comprising a solder pad situated at the corner of the PWB.

12. A printed wiring board (PWB) comprising:
   one or more insulating layers stacked together forming a top surface, a bottom surface, and one or more side surfaces;
   one or more solder pads on at least one of the top surface and the bottom surface, wherein one of the top and bottom surfaces is configured to be mounted to a first circuit board;
   one or more solder pads on at least one of the side surfaces, wherein the one or more solder pads on the at least one of the side surfaces comprises a solder pad situated on at least one of the top surface and the bottom surface, and
   wherein at least one of the one or more side surfaces is configured to be mounted to a second circuit board; and
   an electrical connection through at least one VIA and trace between at least one of the solder pads on the top surface or the bottom surface and at least one of the solder pads on at least one of the side surfaces.

13. The PWB of claim 12 wherein the one or more solder pads on at least one of the top surface and the bottom surface are adapted to facilitate an electrical connection with a sensor.

14. The PWB of claim 12 wherein the first circuit board is mounted on the bottom surface and wherein the top surface is adapted to receive an inertial sensor.

15. The PWB of claim 14 wherein the second circuit board includes an inertial sensor.

16. The PWB of claim 12, wherein the one or more side surfaces comprises a first side surface and a second side surface, wherein one or more solder pads on the first side surfaces extends to the second side surface and comprises a solder pad on the second side surface.

17. A method of making a printed wiring board (PWB), the method comprising:
   providing a PWB with two or more insulating layers and having a top surface, a bottom surface, and one or more side surfaces, at least one of the one or more side surfaces and at least one of the top and the bottom surfaces comprising solder pads;
   drilling multiple holes in at least one of the two or more layers in a selective pattern creating voids;
   drilling at least one hole in at least one of the two more layers creating at least one VIA;
   applying a plating to the one or more layers;
   cutting the at least one of the two or more layers along a path to expose the voids;
   configuring at least one of the solder pads to extend from one of the side surfaces to at least one of the top surface and the bottom surface; and
   mounting a first circuit board to one of the one or more side surfaces.

18. The method of claim 17 further comprising stacking the two or more layers prior to the cutting step.

19. A method of making a printed wiring board (PWB) having a top surface, a bottom surface, and one or more side surfaces, at least one of the one or more side surfaces comprising solder pads, the method comprising:
   drilling multiple holes in at least one of two or more insulated layers in a selective pattern creating voids;
   drilling at least one hole in at least one of the two more layers creating at least one VIA:
   stacking the two or more layers together;
   cutting the at least one of the two or more layers along a path to expose the voids such that the voids extend from the top surface or the bottom surface, wherein at least one of the voids defines a solder pad that extends from the one or more side surfaces to the top surface or the bottom surface;
   plating the voids with a conductive material; and
   mounting a first circuit board to one of the one or more side surfaces.

20. The method of claim 19 further comprising the step of patterning one or more of the layers with a conductive layer so that the plating is electrically connecting to a top surface of the PWB.

* * * * *